United States Patent [19]

Masuda et al.

[11] Patent Number: 4,808,850
[45] Date of Patent: Feb. 28, 1989

[54] COMPOSITE CIRCUIT OF BIPOLAR TRANSISTORS AND FIELD EFFECT TRANSISTORS

[75] Inventors: Ikuro Masuda; Masahiro Iwamura, both of Hitachi; Motohisa Nishihara, Katsuta, all of Japan

[73] Assignee: Hitachi, Ltd., Tokyo, Japan

[21] Appl. No.: 129

[22] Filed: Jan. 2, 1987

Related U.S. Application Data

[62] Division of Ser. No. 633,476, Jul. 23, 1984, Pat. No. 4,661,723.

[30] Foreign Application Priority Data

Jul. 25, 1983 [JP] Japan .................................. 58-134433

[51] Int. Cl.⁴ .................. H03K 19/02; H03K 19/094; H03K 17/60
[52] U.S. Cl. ..................................... 307/446; 307/451; 307/570
[58] Field of Search .......................... 307/445–446, 307/451, 468–469, 570

[56] References Cited

U.S. PATENT DOCUMENTS 4,616,146 10/1986 Lee et al. ............................. 307/451

FOREIGN PATENT DOCUMENTS 0099100 1/1984 European Pat. Off. ............ 307/570
0145004 6/1985 Japan .................................. 307/446

Primary Examiner—John S. Heyman
Assistant Examiner—M. R. Wambach
Attorney, Agent, or Firm—Antonelli, Terry & Wands

[57] ABSTRACT

A novel composite circuit comprises a first bipolar transistor with a collector of a first conductivity type connected to a first potential, an emitter of the first conductivity type connected to an output, a second bipolar transistor with a collector of the first conductivity type connected to the output and an emitter of the first conductivity type connected to a second potential, a field effect transistor of a second conductivity type with a gate connected to an input, a source connected to a third potential and a drain connected to the base of the first bipolar transistor, a field effect transistor of the first conductivity type with a gate connected to the input, a drain connected to the base of the first bipolar transistor, and a source connected to the base of the second bipolar transistor, and a unidirectional element inserted between the output and the drain of the field effect transistor of the first conductivity type and having a direction of rectification opposite to that of the PN junction formed between the base and emitter of the first bipolar transistor.

4 Claims, 16 Drawing Sheets

COMPOSITE CIRCUIT OF BIPOLAR TRANSISTORS AND FIELD EFFECT TRANSISTORS

This is a divisional of application Ser. No. 633,476, filed July 23, 1984, now U.S. Pat. No. 4,661,723.

The present invention relates to a composite circuit, or more in particular to a composite circuit comprising a combination of field effect transistors and bipolar transistors.

An inverter circuit as shown in FIG. 1 is well known as a composite circuit of field effect transistors and bipolar transistors aimed at an increased operating speed and a savings of power consumption (Japanese Patent Application Laid-Open No. 148469/79).

This inverter circuit comprises a P-channel metal-oxide semiconductor (hereinafter referred to as the P-MOS) 50, an N-channel metal-oxide semiconductor (hereinafter referred to as the N-MOS) 51, an NPN bipolar transistor 53, and a PNP bipolar transistor 54 (hereinafter referred to as the NPN and the PNP). In this circuit, when the input 55 is logical "0", the P-MOS 50 is turned on and the N-MOS 51 is turned off. The base potential of the NPN 53 and the PNP 54 increases, so that the NPN 53 is turned on while the PNP 54 is turned off, thereby raising the output 56 to logical "1". In response to the input 55 at logical "1" level, on the other hand, the P-MOS 50 is turned off and the N-MOS 51 is turned on. The base potentials of the NPN 53 and the PNP 54 decrease, so that the NPN 53 is turned off while the PNP 54 is turned on, thereby reducing the output 56 to logical "0".

It is difficult to match the switching characteristics of the NPN 53 and the PNP 54 which are complementary with each other.

Also, an inverter circuit as shown in FIG. 2 is illustrated in FIG. 8, pp. 945 to 951, IEEE Trans. Electron Devices, Vol. ED-16, No. 11, November 1969.

The inverter circuit in the cited reference comprises a P-channel MOS 201, an N-channel MOS 202, a first NPN 301 and a second NPN 302. In this inverter circuit, when the first and second NPN 301 and 302 are to be turned off, the charges stored in the base node cannot be discharged forcibly and therefore it takes a long time to completely turn off the NPN 301 and 302. As a result, both the first and second NPN 301 and 302 remain in the on-state for a long time, thereby leading to the disadvantages of high power consumption and a long switching time.

Further, an inverter circuit as shown in FIG. 3 is illustrated in FIG. 10 of the cited reference. The inverter circuit of FIG. 3, as compared with that of FIG. 2, additionally comprises an N-MOS 203 and a P-MOS 204. The N-MOS 203 is used for forcibly discharging the charges stored in the base node when the first NPN 301 is turned off, while the P-MOS 204 is used for forcibly discharging the charges stored in the base node when the second NPN 302 is turned off. By these means, this inverter circuit is increased in speed to some degree as compared with the inverter circuit of FIG. 2. Since the gate of the P-MOS 203 and N-MOS 204 are connected to an input IN, the number of input gates are increased, and therefore an increased input capacity makes it impossible to increase the operating speed of the circuit.

The problem with these conventional inverter circuits is that low power consumption and high speed operation, which are advantageous features of the bipolar transistors and the field effect transistors, respectively, cannot be obtained to the desired degree.

Accordingly, it is the object of the present invention to provide a composite circuit comprising field effect transistors and bipolar transistors which is high in operation speed and low in power consumption, thereby obviating the shortcomings of the above-mentioned conventional composite circuits.

According to one aspect o the present invention, there is provided a composite circuit comprising a first bipolar transistor with the collector of a first conductivity type connected to a first potential and the emitter of the first conductivity type connected to an output, a second bipolar transistor with the collector of the first conductivity type connected to the output and the emitter of the first conductivity type to a second potential, a field effect transistor of a second conductivity type with the gate connected to an input, the source connected to a third potential and the drain connected to the base of the first bipolar transistor, a field effect transistor of the first conductivity type with the gate connected to the input, the drain connected to the base of the first bipolar transistor and the source connected to the base of the second bipolar transistor, and an unidirectional element inserted between the output and the drain of the field effect transistor of the first conductivity type and having the direction of rectification opposite to that of the PN junction formed by the base and emitter of the first bipolar transistor.

According to another aspect of the present invention, there is provided a composite circuit comprising a first bipolar transistor with the collector of a first conductivity type connected to a first potential, and the emitter of the first conductivity type to an output, a second bipolar transistor with the collector of the first conductivity type connected to the output and the emitter of the first conductivity type to a second potential, k inputs (k≧2), k field effect transistors of a second conductivity type with the gates connected to the inputs respectively, and the sources and drains inserted in parallel between a third potential and the base of the second conductivity type of the first bipolar transistor respectively, and k field effect transistors of the first conductivity type with the gates connected to the inputs respectively, and the drains and sources connected in series to the base of the first bipolar transistor and the base of the second conductivity type of the second bipolar transistor.

According to still another aspect of the present invention, there is provided a composite circuit comprising a first bipolar transistor with the collector of a first conductivity type connected to a first potential and the emitter of the first conductivity type connected to an output, a second bipolar transistor with the collector of the first conductivity type connected to the output and the emitter of the first conductivity type to a second potential, k inputs (k≧2), k field effect transistors of the second conductivity type with the gates connected to the inputs respectively, and the sources and drains connected respectively in series to a third potential and the base of the second conductivity type of the first bipolar transistor, and k field effect transistors of the first conductivity type with the gates connected to the inputs respectively, and the drains and sources connected in parallel respectively with the base of the first bipolar transistor and the base of the second conductivity type of the second bipolar transistor.

The above and other objects, features and advantages of the present invention will be apparent from the detailed description taken in conjunction with the accompanying drawings, in which.

The present invention will be described in detail below with reference to the embodiments.

EMBODIMENT 1

Figure 4:
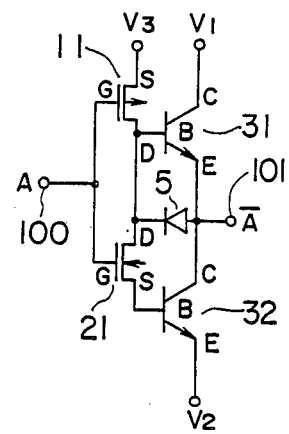
FIG. 4 shows an inverter circuit according to a first embodiment of the present invention.

An inverter circuit making up a first embodiment of the present invention is shown in FIG. 4.

In FIG. 4, reference numeral 31 designates a first bipolar transistor including an N-type collector connected to a first potential $V_1$, a P-type base and an N-type emitter E connected to an output terminal 101. Numeral 32 designates a second bipolar transistor including an N-type collector C connected to the output terminal 101, a P-type base and an N-type emitter connected to a second potential $V_2$. Numeral 11 designates a P-MOS with the gate G connected to an input terminal 100, the source S connected to a third potential $V_3$ and the drain D connected to the base B of the first NPN 31. Numeral 21 designates an N-MOS with the gate G connected to the input terminal 100, the drain D connected to the base B of the first NPN 31 and the source S connected to the base B of the second NPN 32. Numeral 5 designates a diode which is a unidirectional element connected between the output terminal 101 and commonly connected the drain D of the N-channel MOS 21, the base B of the first NPN 31 and the drain D of the P-MOS 11, and having the direction of rectification opposite to that of the PN junction formed by the P-type base and the N-type emitter of the first NPN 31.

Table 1 shows the logic operation of the embodiment under consideration.

TABLE 1

| Input 100 | P-channel MOS 11 | N-channel MOS 21 | NPN bipolar transistor 31 | NPN bipolar transistor 32 | Output 101 |
|---|---|---|---|---|---|
| "0" | ON | OFF | ON | OFF | "1" |
| "1" | OFF | ON | OFF | ON | "0" |

When the input 100 is logical "0", the P-MOS 11 is turned on while the N-MOS 21 is turned off. Thus, the current supplied through the P-MOS 11 is blocked by the N-MOS 21 and the diode 5, and therefore the current flows only in the base B of the first NPN 31. The base potential of the first NPN 31 increases thereby to turn on the first NPN 31. In this process, the N-MOS 21 is turned off, and therefore the base current to the second NPN 32 is stopped thereby to turn off the second NPN 32.

As a result, the emitter current of the first NPN 31 charges a load (not shown) connected to the output terminal 101, so that the output 101 is rapidly raised to logical "1".

When the input 100 is logical "1", on the other hand, the P-MOS 11 is turned off and the N-MOS 21 is turned on. Since the P-MOS 11 is turned off, current supply to the first NPN 31 is stopped. At the same time, the charges stored in the base node of the first NPN 31 directly discharge by the N-MOS 21, thus rapidly turning off the first NPN 31. On the other hand, the N-MOS 21 is turned on thereby the discharge current due to charges stored in base node of first NPN 31 and the current from the output terminal 101 through the diode 5, are supplied to the base B of the second NPN 32, thus rapidly turning on the second NPN 32. As a result, the output 101 is rapidly falling to logical "0".

Figure 1:
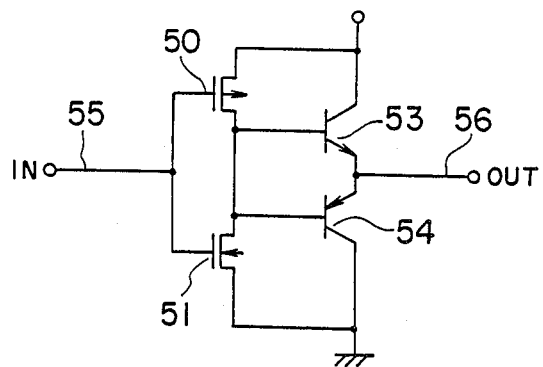
FIG. 1 is a diagram showing a conventional inverter circuit.
Figure 2:
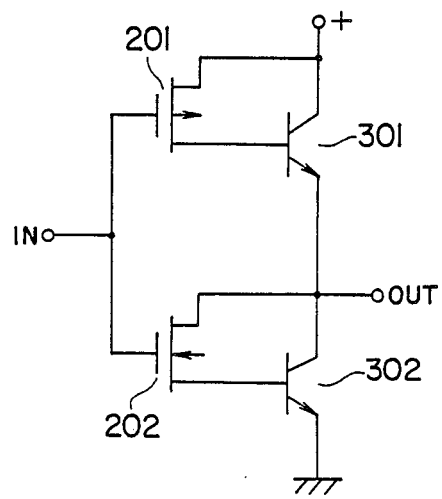
FIG. 2 is a diagram showing a conventional inverter circuit.
Figure 3:
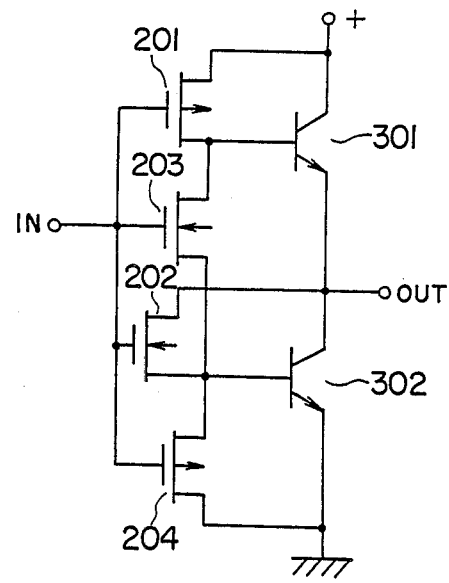
FIG. 3 is a diagram showing an inverter circuit suggested previously by the same inventors.

According to this embodiment, there is provided a means for discharging the charges stored in the base node of the first NPN 31 and the diode 5, whereby the number of input gates is reduced by half of those included in FIG. 3, to the same number of input gates in FIG. 2, thereby permitting an increase in the speed of the circuit operation without increasing the input capacitance thereof.

In view of the fact that the drain D of the P-MOS 11 and the drain D of the N-MOS 21 are directly connected only with wiring and that the diode 5 is provided, the turning on of the P-MOS 11 causes the entire current to flow to the base B of the first NPN 31, thereby rapidly turning on the same transistor. Further, the fact that the charges stored in the base node of the first NPN 31 are discharged directly to the base B of the second NPN 32 through the N-MOS 21 permits an increased speed of circuit operation on the one hand and shortens the time when both the first NPN 31 and the second NPN 32 are kept on the other hand. Consequently, a conduction path is not formed between the second potential $V_2$ and the first or third potential $V_1$, $V_3$ ($V_2 < V_1$, $V_3$), thus reducing the power consumption.

In this embodiment, the first and third potentials are assumed to be substantially the same. In the case where the first potential $V_1$ is higher than the third potential $V_3$ (for example when $V_1 = 5V$, $V_2 =$ earth potential, $V_3 = 4V$), however, the first NPN 31 increases in $h_{fe}$, and therefore the speed of circuit operation further increases.

EMBODIMENT 2

Figure 5:
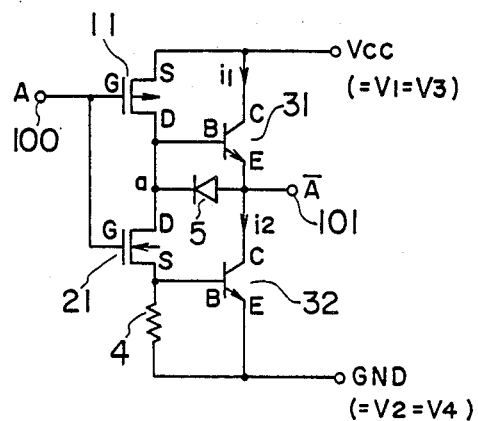
FIGS. 5, 6 and 7 are diagrams showing an inverter circuit according to a second embodiment of the present invention.

FIG. 5 shows an inverter circuit making up a second embodiment of the present invention, in which the same reference numerals as in FIG. 4 designate the same or equivalent component elements as in FIG. 4.

A resistor 4 for discharging the charges stored in the base node of the second NPN 32 is inserted between the base B of the second NPN 32 and a fourth potential $V_4$ making up the earth potential GND.

In FIG. 5, the first potential $V_1$ and the third potential $V_3$ are held at the power source potential VCC, and the second potential $V_2$ and the fourth potential $V_4$ at the earth potential GND.

The logic operation of the embodiment under consideration is identical to that of the first embodiment shown in Table 1.

Figure 6:
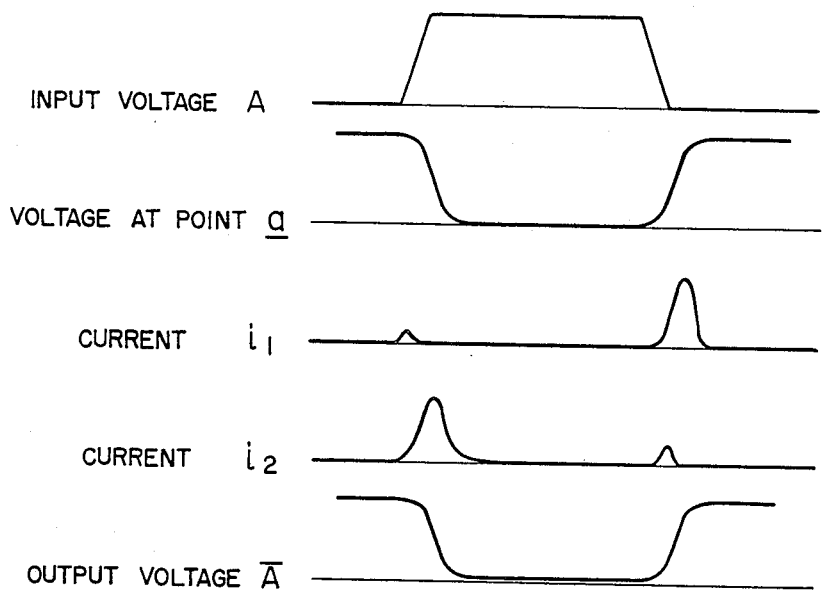

Operation waveforms of the embodiment under consideration are shown in FIG. 6.

When the input changes from "low" to "high", P-MOS 11 changes its state from on to off and while the N-MOS 21 changes its state from off to on. Therefore, the potential at point a connecting them begins to decrease. At the same time, the base B of the second NPN 32 begins to be supplied with the discharge current due to charges stored in base node of first NPN 31 through the N-MOS 21 on the one hand and the current from the output terminal 101 through the diode 5 on the other hand. As a result, the collector current $i_2$ flows in the second NPN 32, and the capacitance of the load (not shown) connected to the output terminal 101 is discharged so that the output voltage thereof begins to fall. Under this condition, as mentioned above, the charges stored in the base node of the first NPN 31 are discharged through the N-MOS 21, and fail to flow in the base B of the first NPN 31. Most current thus flows from the first potential $V_1$ and the third potential $V_3$ (=VCC) to the second potential $V_2$ and the fourth potential $V_4$ (=GND), while very small current ($i_l$) flows through the first and second NPN 31, 32.

When the input changes from "high" to "low" level, on the other hand, the P-MOS 11 turns from off to on, and the N-MOS 21 turns from on to off. As a consequence, the potential at point a begins to increase, and at the same time, the base B of the first NPN 31 begins to be supplied with current through the P-MOS 11 from the third potential $V_3$ (=VCC). The collector current $i_1$ thus flows in the first NPN 31, and the output voltage $\overline{A}$ begins to rise. The current supplied through the P-MOS 11, however, which is blocked by the diode 5 and the N-MOS 21 being turned off, thereby effectively driving the first NPN 31. In this process, the charges stored in base node of the second NPN 32 are discharged by the resistor 4. Therefore, the current flows from the first potential $V_1$ and the third potential $V_3$ (=VCC) to the second potential $V_2$ and the fourth potential $V_4$ (=GND) with very small current $i_2$ flowing through the first and second NPNs 31, 32. In this way, in the circuit of FIG. 5, the current $i_1$, $i_2$ flowing from the first and third potentials (=source potential VCC) to the second and fourth potentials (=earth potential) through a couple of NPNs 31 and 32 at the time of switching is substantially eliminated. The power consumption is thus reduced on the one hand, and the base of the first NPN 31 is effectively driven to realize a high speed circuit operation on the other hand. Further, according to the present embodiment, as in the previous embodiment, the provision of the diode 5 prevents the input capacitance from increasing, and when the input voltage A changes from "low" to "high", that is, when the output voltage $\overline{A}$ changes from "high" to "low", current is supplied to the base B of the second NPN 32 through the N-MOS 21 turned on. Therefore, if a large capacitive load is connected (not shown) to the output terminal 101, the second NPN 32 is turned from off to on at high speed, thereby making possible a high-speed circuit operation with low power consumption.

Further, because of the provision of the resistor 4, the second NPN 32 turns from on to off at higher speed, thereby increasing the operating speed and reducing the power consumption even more.

Figure 7:
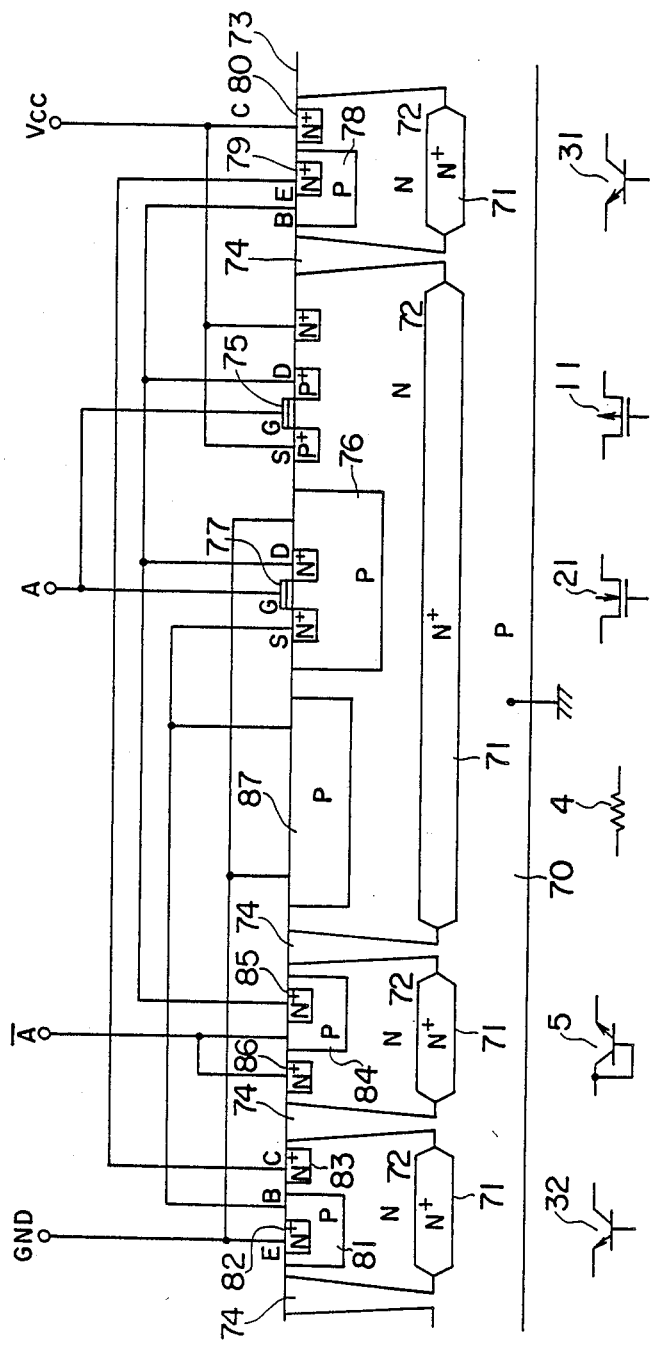

FIG. 7 is a sectional view schematically showing the inverter circuit of FIG. 5 fabricated on a semiconductor substrate. Symbols of circuit elements including transistors and resistors are shown in the bottom at positions corresponding to their respective locations in the drawing.

An N+-type buried layer 71 is formed by thermal diffusion on a semiconductor substrate 70 made of a P-type silicon. An N-type semiconductor layer 72 is then formed by such means as epitaxial growth. The P-type diffusion is effected by thermal diffusion from the main surface 73 to the depth reaching the P-type substrate material 70 thereby to form an isolation region 74 between the elements. The source S and the drain D regions of the P-MOS 11 are formed by injection of P+-type material, so that a gate electrode 75 with a thin oxide film is formed between the regions. The gate electrode 75 is generally made of poly-silicon. An N-type semiconductor layer 72 making up the substrate of the P-MOS 11 is connected to the power supply VCC of highest potential. The source S and the drain D of the N-MOS 21, are formed by injection of an N+-type material in the P-type well region 76 formed by thermal diffusion in the N-type semiconductor layer 72, and have therebetween a gate electrode 77 with a thin oxide film. The P-type well region 76 making up the substrate of the N-MOS 21 is connected to the earth potential GND of the lowest potential.

A P-type base region 78 of the first NPN 31 is formed by thermal diffusion in the N-type semiconductor layer 72. Further, an N+-type emitter region 79 thereof is formed by injection or thermal diffusion in the P-type base region 78. The N-type semiconductor 72 provides a collector region, and is connected to the source potential VCC by wiring such as of aluminum through an ohmic contact of the N+-type high impurity concentration layer 80. In similar manner, a P-type base region 81 and an N-type emitter region 82 of the second NPN 32 are formed, and the N-type collector 72 is connected to the emitter of the first NPN 31 by wiring through an ohmic contact of the N+-type high impurity concentration layer 83.

The diode 5 is so constructed that a collector, a base and an emitter region are formed by the same processes as the first and second NPNs 31 and 32, and the collector and the base are commonly connected to form an anode of the diode, and the emitter is used as a cathode.

The resistor 4 is formed by a diffusion layer 87 of P-type material on the N-type semiconductor layer 72 in the same island region as the P-channel MOS 11 and N-channel MOS 21, and generally has an sheet resistance of 50 to 300 $\Omega/\square$.

The circuit elements are directly connected with wiring of such material as aluminum, which has a sheet resistance of 0.05 to 0.1 $\Omega/\square$ which is sufficiently small as compared with the resistance value of the resistor 4.

In the first and second embodiments described above, the two NPN bipolar transistors are of the same conduction type and therefore the switching characteristics thereof are easy to match each other.

Further, since a PNP transistor having low cut-off frequency or low current transfer ratio is not used, the rising speed and falling speed of an output signal is not decayed, thus making possible high-speed circuit operation.

Figure 25:
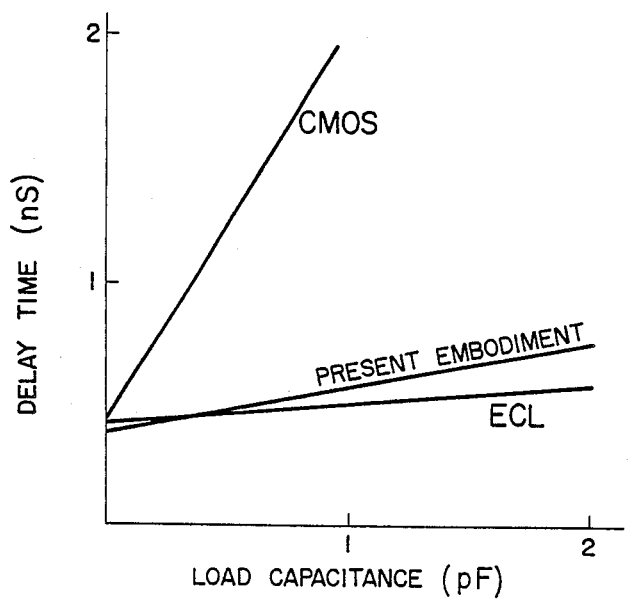
FIGS. 25 and 26 are diagrams for explaining the effects of the second embodiment of the present invention.
Figure 26:
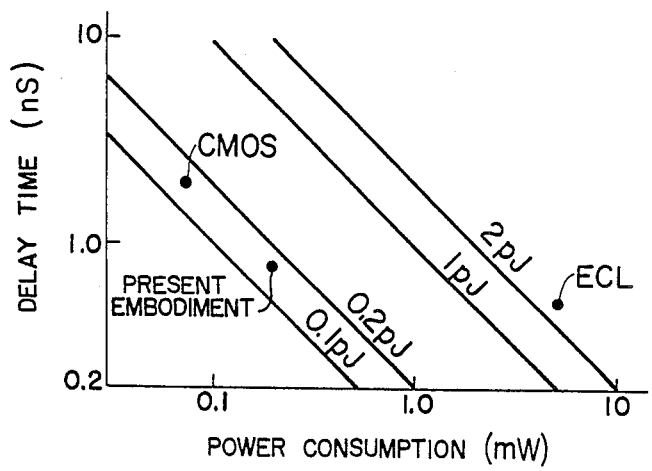
Figure 27:
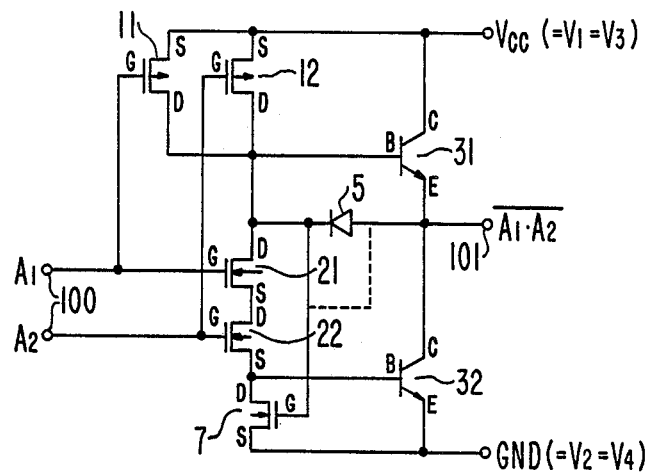
FIGS. 27 to 32 are diagrams showing modifications of various ones of the foregoing inverters for use as NAND and NOR circuits.
Figure 28:
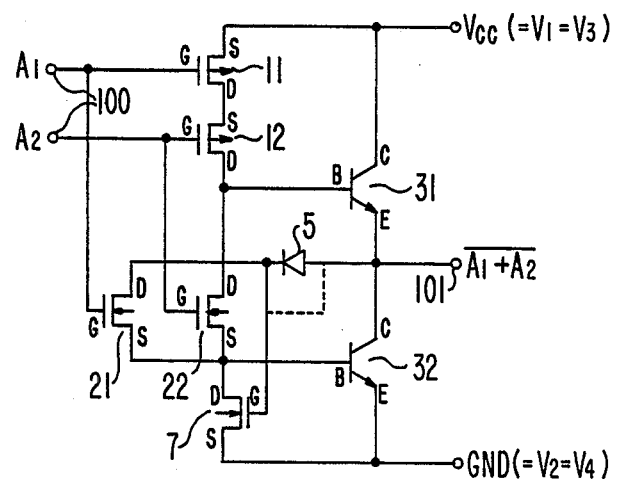
Figure 29:
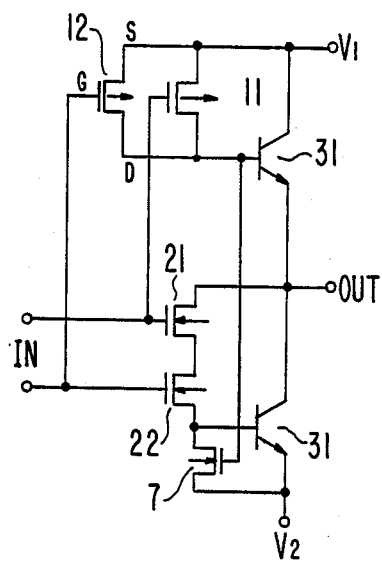
Figure 30:
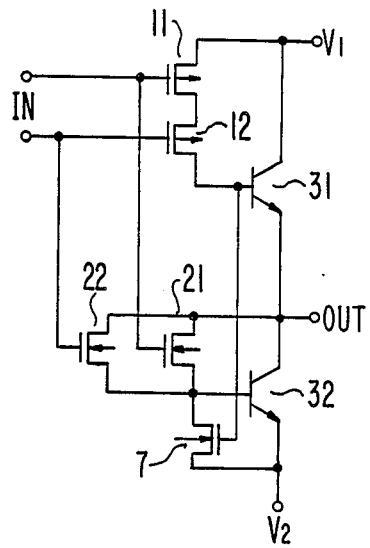
Figure 31:
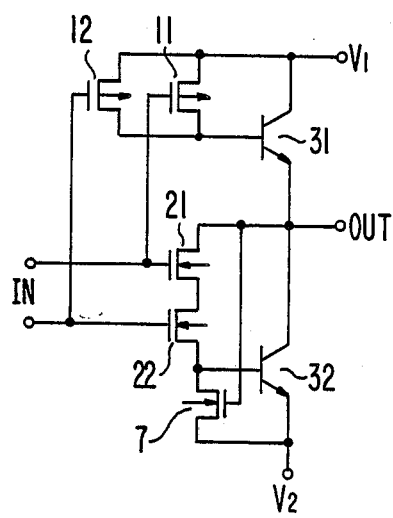
Figure 32:
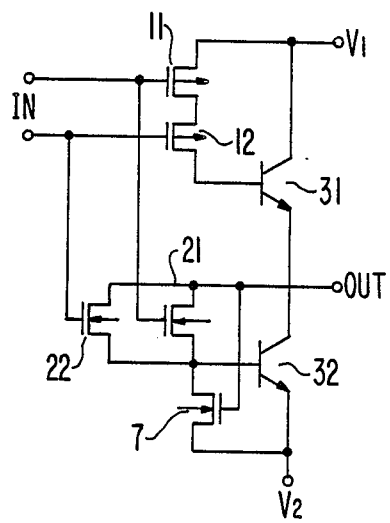

As will be seen from the foregoing description of the embodiment under consideration, an inverter circuit is realized which takes advantage of the characteristics of a bipolar transistor and a MOS transistor, thereby achieving both a high-speed circuit operation and a low power consumption at the same time. In FIGS. 25 and 26, the characteristics obtained by the embodiment under consideration are compared with those of a CMOS logic circuit and an ECL logic circuit made up of the same CMOS or bipolar transistor. Specifically, FIG. 25 shows the relationship between a load capacitance and the delay time, from which it is seen that the circuit according to this embodiment is much more excellent than CMOS and has a speed as high as the fastest ECL among the circuits so far well known. FIG. 26, on the other hand, illustrates the relationship between delay time and power consumption, and indicates that the power consumption of the circuit according to the present embodiment is very small as compared with that of the ECL having similar speed characteristic and almost the same as that of CMOS.

EMBODIMENT 3

Figure 8:
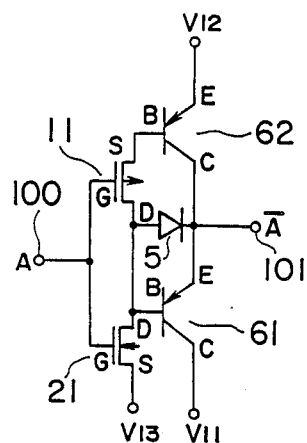
FIG. 8 is a diagram showing an inverter circuit according to a third embodiment of the present invention.

An inverter circuit according to a third embodiment of the present invention is shown in FIG. 8.

In FIG. 8, numeral 61 designates a first PNP bipolar transistor, (hereinafter referred to as the first PNP) including a P-type collector C connected to a first potential $V_{11}$, an N-type base B and a P-type emitter E connected to an output terminal 101. Numeral 62 designates a second PNP bipolar transistor (hereinafter referred to as the second PNP) including a collector C connected to the output terminal 101, an N-type base B, and a P-type emitter E connected to a second potential $V_{12}$. Numeral 11 designates a P-MOS including a gate G connected to an input terminal 100, a drain D connected to the base B of the first PNP 61, and a source S connected to the base B of the second PNP 62. Numeral 21 designates an N-MOS including a gate G connected to the input terminal 100, a source S connected to a third potential $V_{13}$, and a drain D connected to the base B of the first PNP 31. Numeral 5 designates a diode connected between the output terminal 101 and commonly connected the drain D of the P-MOS 11, the base B of the first PNP 61 and the drain D of the N-MOS 21 and base B of second PNP 62 which diode makes up a unidirectional element having the direction of rectification opposite to that of the PN junction between the N-type base B and the P-type emitter E of the first PNP 61.

The circuit according to this embodiment, in which the conduction types are reversed to those in the first embodiment shown in FIG. 4, performs the same logic operation and has the same effect as the first embodiment.

EMBODIMENT 4

Figure 9:
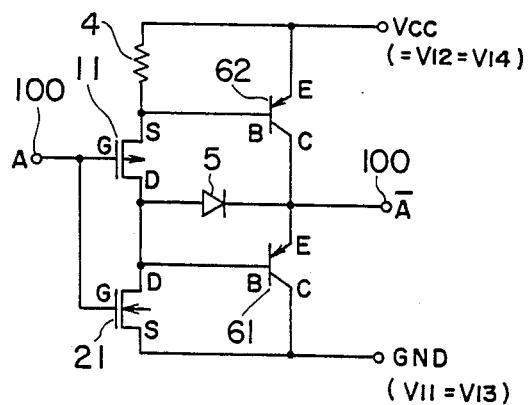
FIGS. 9 and 10 are diagrams showing an inverter circuit according to a fourth embodiment of the present invention.

An inverter circuit according to a fourth embodiment of the present invention is shown in FIG. 9, in which the component elements identical or equivalent to those in FIG. 8 are designated by the same reference numerals as in FIG. 8.

In FIG. 9, the first potential $V_{11}$ and the third potential $V_{13}$ are held at the earth potential GND, while the second potential $V_{12}$ and the fourth potential $V_{14}$ are held at the source potential VCC.

Figure 10:
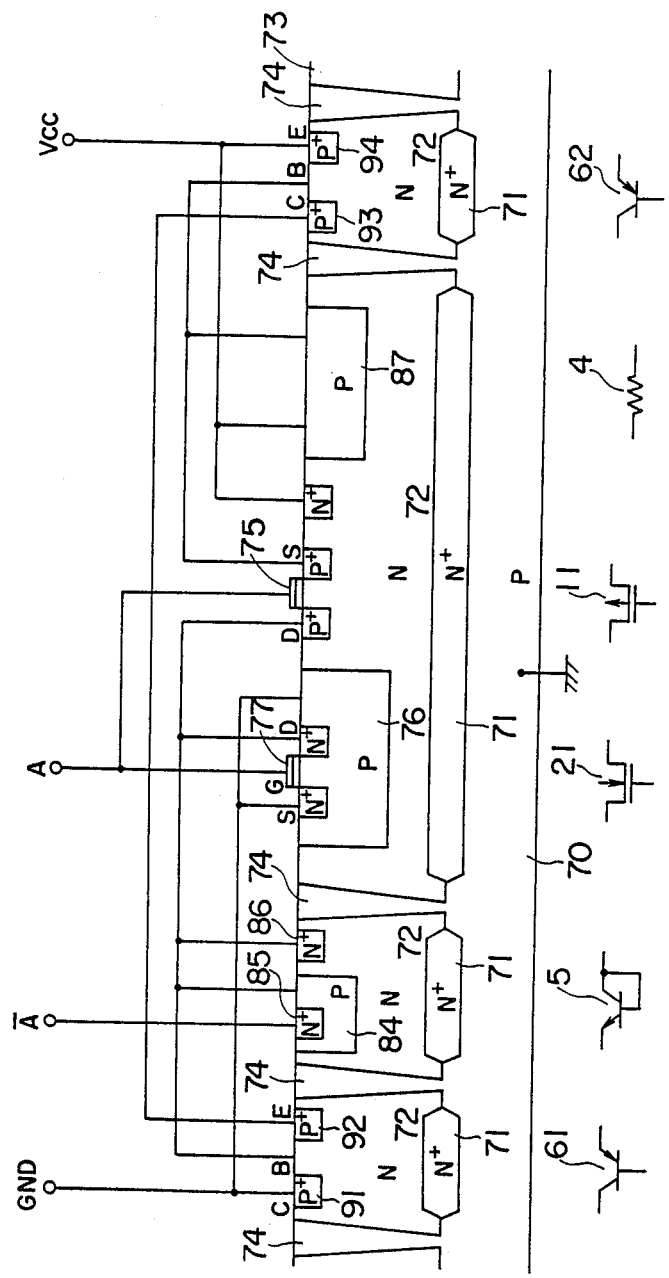

The sectional view of FIG. 10 schematically shows the inverter circuit of FIG. 9 fabricated on a semiconductor substrate. In FIG. 10, the same component elements as those in FIG. 9 are designated by the same reference numerals as in FIG. 9 and will not be described. Symbols of circuit elements such as transistors and resistors are indicated at the bottom of the diagram at positions corresponding to the location thereof in the diagram. The first PNP bipolar transistor 61 is of what is called lateral type having a base region in the N-type semiconductor layer 72 and a P+-type collector 91 and a P+-type emitter 92 formed by thermal diffusion or injection, the collector 91 being connected to the earth potential GND. In similar fashion, the second PNP bipolar transistor 62 is of lateral type having a base region in th N-type semiconductor layer 72 and a P+-type collector 93 and an emitter 94 formed by thermal diffusion or injection, in which the emitter 94 is connected to the source potential VCC and the collector 93 is connected by wiring to the emitter 92 of the first PNP 61.

The conduction types of this embodiment are reverse to those of the second embodiment shown in FIGS. 5 to 7 with the same effect as the second embodiment.

EMBODIMENT 5

Figure 11:
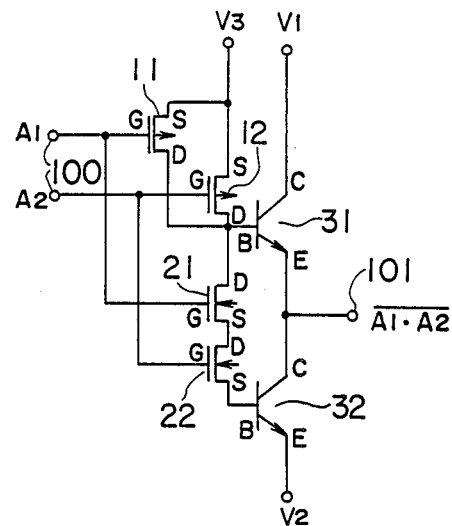
FIG. 11 shows a 2-input NAND circuit according to a fifth embodiment of the present invention.

FIG. 11 shows a 2-input NAND circuit according to a fifth embodiment of the present invention, in which the same reference numerals as in FIG. 4 designate the component elements identical or equivalent to those in FIG. 4.

In FIG. 11, numeral 31 designates a first NPN bipolar transistor including an N-type collector C connected to the first potential $V_1$, a P-type base B and an N-type emitter E connected to an output terminal 101. Numeral 32 designates a second NPN bipolar transistor including an N-type collector C connected to the output terminal 101, a P-type base B and an N-type emitter E connected to the second potential $V_2$ Numeral 100 designates an input terminal supplied with input signals $A_1$ and $A_2$.

Numerals 11 and 12 designate P-channel MOSs including gates G respectively connected to different input terminals 100, and sources S and drains D connected in parallel between the third potential $V_3$ and the base B of the first NPN 31. Numerals 21 and 22 designate N-channel MOSs including gates G respectively connected to different input terminals 100, and drains D and sources S connected in series by wiring directly to the base B of the first NPN 31 and the base B of the second NPN 32.

Table 2 shows logic operations of the embodiment under consideration.

TABLE 2

| Input 100 | P-channel MOS 11, 12 | N-channel MOS 21, 22 | NPN bipolar transistor 31 | NPN bipolar transistor 32 | Output 101 |
|---|---|---|---|---|---|
| One input "0" | One MOS ON | One MOS OFF | ON | OFF | "1" |
| Both "0" | Both ON | Both OFF | ON | OFF | "1" |
| Both "1" | Both OFF | Both ON | OFF | ON | "0" |

First, when one of the inputs is logical "0", one of the P-MOSs 11 and 12 is turned on, and one of the N-MOSs 21 and 22 is turned off. The current flowing through one of the P-MOSs 11 and 12 that has been turned on is blocked by one of the N-MOSs 21 and 22 that has been turned off, so that substantially no current flows in other than the base B of the first NPN 31. The base potential of the first NPN 31 thus increases thereby to turn on the first NPN 31. In this process, one of the N-MOSs 21 and 22 is turned off, and therefore current supply to the second NPN 32 is stopped thereby to turn off the same transistor.

As a result, the emitter current of the first NPN 26 charges the capacitive load (not shown) connected to the output terminal 101, thereby raising the output 101 rapidly to logical "1" level.

When both inputs 100 are logical "0", on the other hand, both of the P-MOSs 11 and 12 are turned on, and both of the N-MOSs 21 and 22 are turned off. The resultant operation is the same as that of the preceding case, raising the output 101 rapidly to logical "1" level.

When both inputs 100 are at logical "1" level, both of the P-MOSs 11 and 12 are turned off, and both of the N-MOSs 21 and 22 are turned on. Since both the P-MOSs 11 and 12 are turned off, current to the first NPN 31 is stopped on the one hand, and the charges stored in the base node of the first NPN 31 are discharged through the N-MOSs 21 and 22, thus turning off the first NPN 32 rapidly on the other hand. At the same time, the N-MOSs 21 and 22 are turned on, thereby the discharge current due to the charges stored in base node of first NPN 31 is supplied to the base B of second NPN 32, thus turning on the second NPN 32 rapidly. As a consequence, the output 101 is rapidly fall to logical "0" level.

The embodiment under consideration achieves the same effect as the first embodiment.

In addition to the 2-input NAND circuit taken as an example for explanation of the embodiment, the present invention may be applied with equal effect to a 3-input NAND circuit, 4-input NAND circuit or generally, k-input HAND circuit ($k \geq 2$).

EMBODIMENT 6

Figure 12:
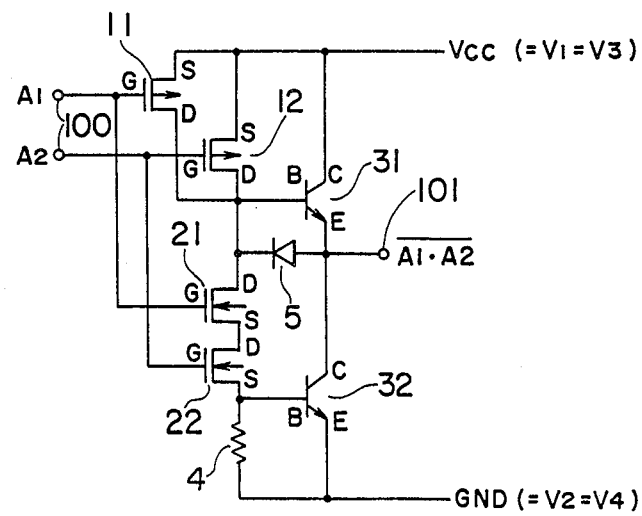
FIG. 12 shows a 2-input NAND circuit according to a sixth embodiment of the present invention.

FIG. 12 shows a 2-input NAND circuit according to a sixth embodiment of the present invention, in which the component elements identical or equivalent to those in FIGS. 5 and 11 are designated by the same reference numerals as in FIGS. 5 and 11.

In this embodiment, a diode 5 making up a unidirectional element having the direction of rectification opposite to that of the PN junction between the P-type base B and the N-type emitter E of the first NPN 31 is inserted between the output terminal 101 and commonly connected the drain D of the N-channel MOS 21, the base B of the first NPN 31 and the drain D of the P-MOS 12.

Further, a resistor 4 for discharge the charges stored in the base node of the second NPN 32 is inserted between the base B of the second NPN 32 and the earth potential GND making up the fourth potential $V_4$.

In FIG. 12, the first potential $V_1$ and the third potential $V_3$ are held at the source potential VCC, and the second potential $V_2$ and the fourth potential $V_4$ are held at the earth potential GND.

The logic operation of this embodiment is identical to that of the fifth embodiment shown in Table 2.

Specifically, the present embodiment is made up of the 2-input NAND circuit according to the fifth embodiment shown in FIG. 11 combined with the concept of the second embodiment shown in FIG. 5, and has an effect similar to that of the second or fifth embodiment.

EMBODIMENT 7

Figure 13:
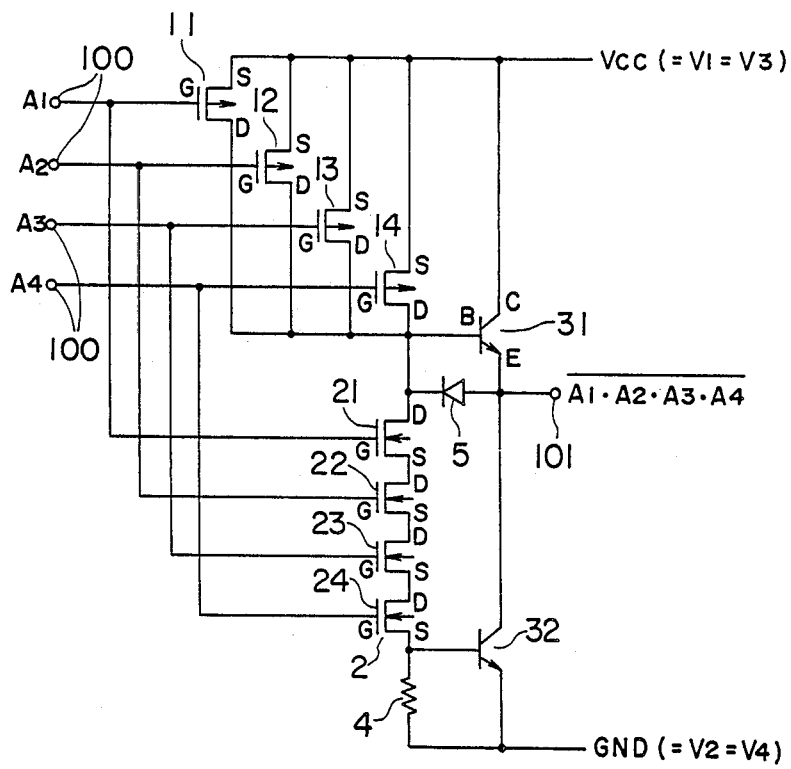
FIG. 13 is a diagram showing a 4-input NAND circuit according to a 7th embodiment of the present invention.

FIG. 13 shows a 4-input NAND circuit according to a seventh embodiment of the present invention, in which the component elements identical or equivalent to those in FIGS. 11 and 12 are designated by the same reference numerals as in FIGS. 11 and 12.

In FIG. 13, numeral 100 designates input terminals supplied with input signals $A_1$, $A_2$, $A_3$ and $A_4$ respectively. Numerals 11, 12, 13, and 14 designate P-MOSs with respective gates G connected to different inputs 100, and sources S and drains D thereof connected respectively in parallel between the power source potential VCC making up the third potential $V_3$ and the base B of the first NPN bipolar transistor 31. Numerals 21, 22, 23 and 24 designate N-MOSs including gates G respectively connected to different input terminals 100, and sources S and drains D directly connected in series respectively by wiring to the base B of the first NPN 31 and the base B of the second NPN 32.

The embodiment under consideration, which is made up of a 4-input NAND circuit combined with the concept of the sixth embodiment, has the same effect as the second and fifth embodiments.

Although the sixth embodiments and the seventh embodiment shown in FIGS. 12 and 13 have been described above with reference to a 2-input NAND circuit and a 4-input NAND circuit, the present invention may be applied with equal effect also to a 3-input NAND circuit, 5-input nand circuit, or generally k-input NAND circuit ($k \geq 2$).

EMBODIMENT 8

Figure 14:
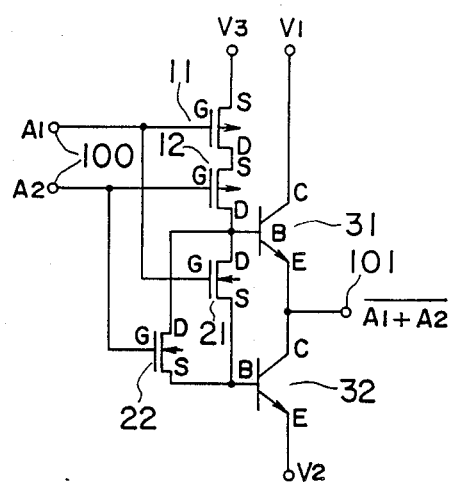
FIG. 14 shows a 2-input NOR circuit according to an 8th embodiment of the present invention.

A 2-input NOR circuit making up an 8th embodiment of the present invention is shown in FIG. 14, in which the same reference numerals as in FIGS. 4 and 11 designate the component elements identical or equivalent to those in FIGS. 4 and 11.

In FIG. 14, numeral 31 designates a first NPN bipolar transistor including an N-type collector C connected to the first potential $V_1$, a P-type base B and an N-type emitter E connected to an output terminal 101. Numeral 32 designates a second NPN bipolar transistor including an N-type collector C connected to the output terminal 101, a P-type base B and an N-type emitter E connected to a second potential $V_2$. Numeral 100 designates input terminals supplied with input signals $A_1$, $A_2$. Numerals 11 and 12 designate P-MOSs including gates G connected to different input terminals 100, sources S and drains D directly connected respectively by wiring in series to a third potential $V_3$ and the base B of the first NPN 31. Numerals 21 and 22 designate N-MOSs including gates G connected respectively to different input terminals 100, and sources S and drains D connected respectively in parallel to the base B of the first NPN and the base B of the second NPN 32.

Table 3 shows the logic operation of the embodiment under consideration.

TABLE 3

| Inputs 100 | P-channel MOS 11, 12 | N-channel MOS 21, 22 | NPN bipolar transistor 31 | NPN bipolar transistor 32 | Output 101 |
|---|---|---|---|---|---|
| Both "0" | Both ON | Both OFF | ON | OFF | "1" |
| One input "1" | One MOS OFF | One MOS ON | OFF | ON | "0" |
| Both "1" | Both OFF | Both ON | OFF | ON | "0" |

When both inputs 100 are logical "0", in the first place, both the P-MOSs 11 and 12 are turned on, while both the N-MOSs 21 and 22 are turned off. The current flowing through the P-MOSs 11 and 12 is thus blocked by the N-MOSs 21 and 22, so that the current substantially fails to flow in other than the base node of the first NPN 31. The base potential of the first NPN 31 is thus increased, and the first NPN 31 is turned on. In this process, since the N-MOSs 21 and 22 are both turned off, current supply to the second NPN 32 is stopped thereby to turn off the second NPN 32.

As a result, the emitter current of the first NPN 37 charges the capacitive load (not shown) connected to the output terminal 101, thereby raising the output 39 rapidly to logical "1".

In the case where one of the inputs 100 is logical "1", on the other hand, one of the P-MOSs 11 and 12 is turned off, while one of the N-MOSs 21 and 22 is turned on. Since the P-MOS 11 or 12 is turned off, current to the first NPN 31 is stopped on the one hand, and the discharge current due to the charges stored in base node of first NPN 31 is supplied to the base B of the second NPN 32, thus rapidly turning on the second NPN 32. In this way, the output 101 is rapidly fall to logical "0".

When both inputs 100 are at logical "1", the P-MOSs 11 and 12 are both turned off, while both the N-MOSs 21 and 22 are turned on. Therefore, the output 101 is fall to logical "0" as in the preceding case.

This embodiment achieves an effect similar to that of the first embodiment or the fifth embodiment.

EMBODIMENT 9

Figure 15:
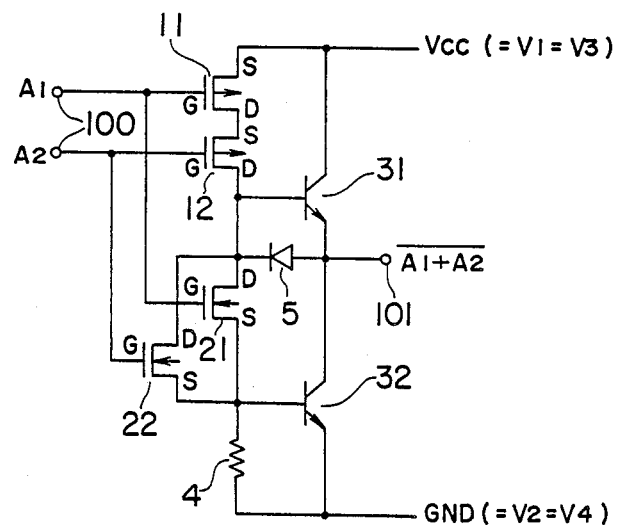
FIG. 15 is a diagram showing a 2-input NOR circuit according to a 9th embodiment of the present invention.

FIG. 15 shows a 2-input NOR circuit according to a ninth embodiment of the present invention, in which the component elements identical or equivalent to those in FIGS. 5 and 12 are designated by the same reference numerals as in FIGS. 5 and 12.

In this embodiment, a diode 5 having the direction of rectification opposite to that of the PN junction formed between the P-type base B and N-type emitter E of the first NPN 31 is inserted between the output terminal 101 and the base B of the first NPN 31.

Further, a resistor 4 for discharge the charges stored in the base node of the second NPN 32 is inserted between the base B of the second NPN 32 and the earth potential GND making up the fourth potential $V_4$.

In FIG. 15, the first potential $V_1$ and the third potential $V_3$ are held at the power source potential level VCC, and the second potential $V_2$ and the fourth potential $V_4$ are held at the earth potential GND.

The logic operation of this embodiment is the same as that of the 8th embodiment shown in Table 3.

Specifically, the embodiment under consideration has the same effect as the 2-input NOR circuit according to the 8th embodiment shown in FIG. 14 combined with the second embodiment shown in FIG. 5.

In addition to the 2-input NOR circuit which was explained above as the 8th embodiment shown in FIG. 14 and the 9th embodiment shown in FIG. 15, the present invention may be applicable also to a 3-input NOR circuit, a 4-input NOR circuit, or generally, k-input NOR circuit ($k \geq 2$) with equal effect.

EMBODIMENT 10

Figure 16:
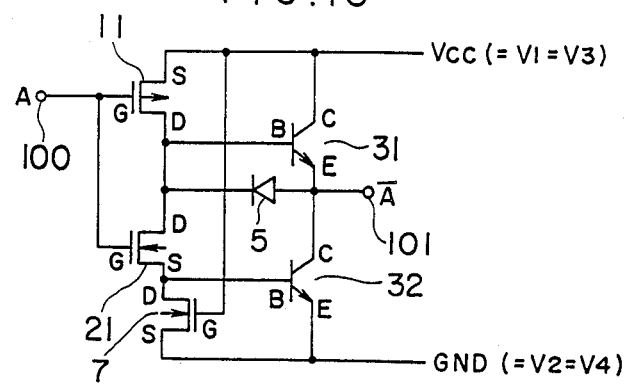
FIG. 16 shows an inverter circuit according to a 10th embodiment of the present invention.

FIG. 16 shows an inverter circuit according to a 10th embodiment of the present invention, in which like component elements as in FIGS. 4 and 5 are denoted by like reference numerals as in FIGS. 4 and 5.

This embodiment is different from the second embodiment shown in FIG. 5 in that, in this embodiment, a second N-MOS 7, instead of the resistor 4, is provided as a circuit element for discharging of the charges stored in the base node of the second NPN 32.

The second N-MOS 7 has the drain D thereof connected to the base B of the second NPN 32, the source S to the earth potential GND making up a fourth potential, and the gate G to the power source potential VCC making up a first potential.

In this embodiment, the second N-MOS 7, like the resistor 4 in FIG. 5, discharges the charges stored in the base node of the second NPN 32 thereby to turn off the second NPN rapidly.

EMBODIMENT 11

Figure 17:
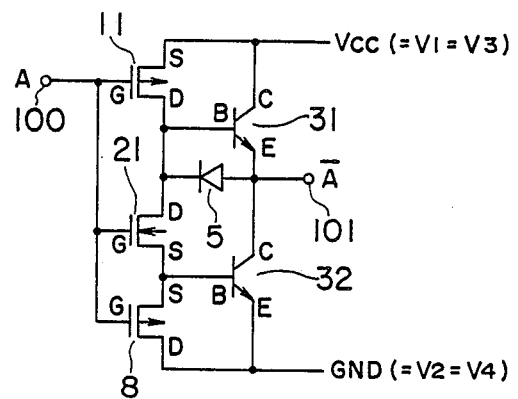
FIG. 17 is a diagram showing an inverter circuit according to an 11th embodiment of the present

FIG. 17 designates an inverter circuit making up an 11th embodiment of the present invention, in which those component elements identical or equivalent to those in FIGS. 4 and 5 are designated by the same reference numerals as in FIGS. 4 and 5.

This embodiment is different from the second embodiment shown in FIG. 5 in that, in this embodiment, a second P-MOS 8 is provided instead of the resistor 4 as a circuit element for discharging of the charges stored in the base node of the second NPN 32.

The second P-MOS 8 has the source S thereof connected to the base B of the second NPN 32, the drain D to the earth potential GND making up a fourth potential, and the gate G to the input 100.

In this embodiment, the second P-MOS 8, like the resistor 4 in FIG. 5, is provided for discharging of the charges stored in the base node of the second NPN 32, thereby rapidly turning off the second NPN 32.

When the N-MOS 21 is turned on, the second P-MOS 8 is turned off, so that the current flowing through the N-MOS 21 is blocked by the second P-MOS 8, and therefore no current substantially flows in other than the base B of the second NPN 32, thereby rapidly turning on the second NPN 32.

EMBODIMENT 12

Figure 18:
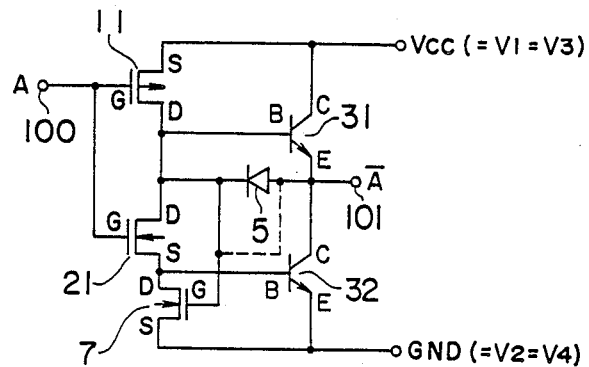
FIGS. 18 and 19 are diagrams showing an inverter according to a 12th embodiment of the present invention.

FIG. 18 shows an inverter circuit making up a 12th embodiment of the present invention, in which the component elements identical or equivalent to those in FIGS. 4 and 5 are designated by the same reference numerals as in FIGS. 4 and 5.

The difference between this embodiment and the second embodiment shown in FIG. 5 lies in that, in this embodiment, the resistor 4 is replaced with a second N-MOS 7 as in the 10th embodiment of FIG. 16 as a circuit element for discharging of the charges stored in the base node of the second NPN 32.

The second N-MOS 7 includes the drain D thereof connected to the base B of the second NPN 32, the source S to the earth potential GND making up a fourth potential, and the gate G to the base B or emitter E of the first NPN 31.

Figure 19:
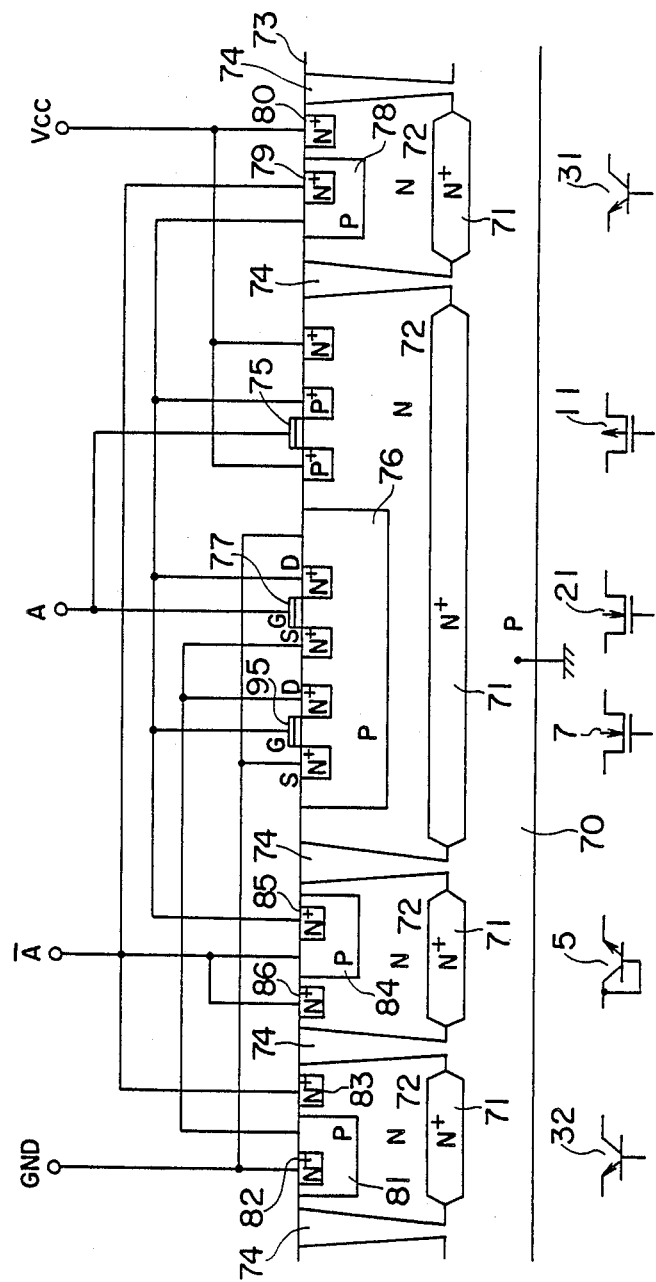

FIG. 19 is a sectional view schematically showing the inverter circuit of FIG. 18 fabricated on a semiconductor substrate, in which the component elements identical to those in FIG. 7 are denoted by the same reference numerals. Also, symbols of the circuit elements including transistors are attached to the bottom at the positions corresponding to the locations of the elements in the diagram. The embodiment of FIG. 19 is the same as that of FIG. 7 except that, in the embodiment of FIG. 19, the resistor 4 of FIG. 7 has been replaced with the second N-MOS 7. The second N-MOS 7, like the N-MOS 21, is so constructed that an N+-type source and drain regions are formed by thermal diffusion or injection in the P-type well region 76 with an electrode 95 formed with a thin oxide film therebetween. The drain D of the second N-MOS 7 is connected to the base B of the second NPN 32, and the source S thereof connected to the earth potential GND. Also, the gate electrode 95 of the second N-MOS 7 is connected to the base B of the first NPN 31, the drain D of the P-MOS 11, the drain D of the N-MOS 21 and the cathode of the diode 5 at the same time.

In this embodiment, the second N-MOS 7, like the resistor 4 in FIG. 5, discharges the charges stored in the base node of the second NPN 32, thereby rapidly turning off the second NPN 32.

When the N-MOS 21 is turned on, the second N-MOS 7 is turned off in complementary operation, and therefore the current flowing through the N-MOS 21 is blocked by the second N-MOS 7, so that the current does not substantially flow in other than the base B of the second NPN 32, thereby turning on the second NPN 32 more rapidly.

EMBODIMENT 13

Figure 20:
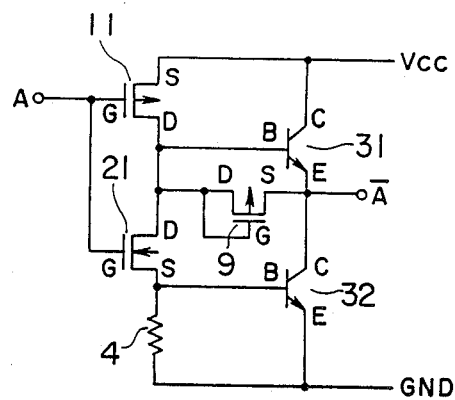
FIG. 20 shows an inverter circuit according to a 13th embodiment of the present invention.

FIG. 20 shows an inverter circuit according to a 13th embodiment of the present invention, in which the component elements identical or equivalent to those in FIGS. 4 and 5 are designated by the same reference numerals as in FIGS. 4 and 5.

This embodiment is different from the second embodiment shown in FIG. 5 in that this embodiment comprises, the diode 5 as a unidirectional element, a P-MOS 9 with the drain D and gate G thereof connected with each other which has a characteristic equivalent to the diode 5.

EMBODIMENT 14

Figure 21:
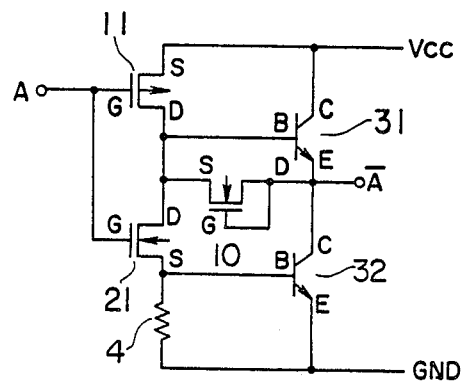
FIG. 21 is a diagram showing an inverter circuit according to a 14th embodiment of the present invention.

FIG. 21 shows an inverter circuit according to a 14th embodiment of the present invention, in which the component elements identical or equivalent to those in FIGS. 4 and 5 are designated by the same reference numerals as in FIGS. 4 and 5.

This embodiment is different from the second embodiment shown in FIG. 5 in that, in this embodiment, there is provided, instead of the diode 5 as a unidirectional element, an N-MOS 10 with the drain D and gate G thereof connected with each other providing the characteristic equivalent to that of the diode 5.

EMBODIMENT 15

Figure 22:
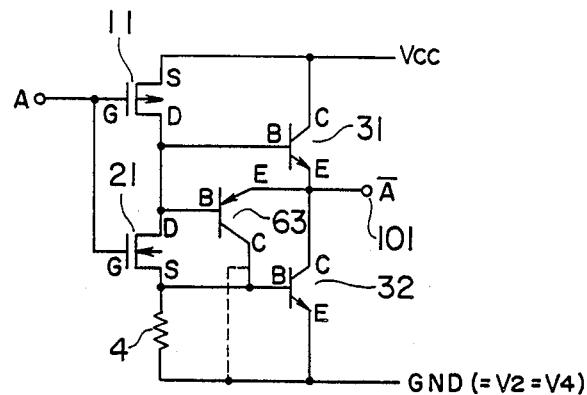
FIG. 22 is a diagram showing an inverter circuit according to a 15th embodiment of the present invention.

FIG. 22 shows an inverter circuit according to a 15th embodiment of the present invention, in which the component elements identical or equivalent to those in FIGS. 4 and 5 are designated by the same reference numerals as those in FIGS. 4 and 5.

The difference of this embodiment from the second embodiment shown in FIG. 5 lies in that, in this embodiment, a PNP transistor 63 has replaced the diode 5 as a unidirectional element. The PNP 63 has the P-type emitter E connected to an output terminal 101, and the N-type base B connected to the drain D of the N-MOS 21, the drain D of the P-MOS 11 and the base B of the first NPN 31. The P-type collector C of the PNP 63, on the other hand, is connected to the base B of the second NPN 32 and the source S of the N-MOS 21 or, as shown by the dashed line in FIG. 22, to the earth potential GND making up a second potential $V_2$.

EMBODIMENT 16

Figure 23:
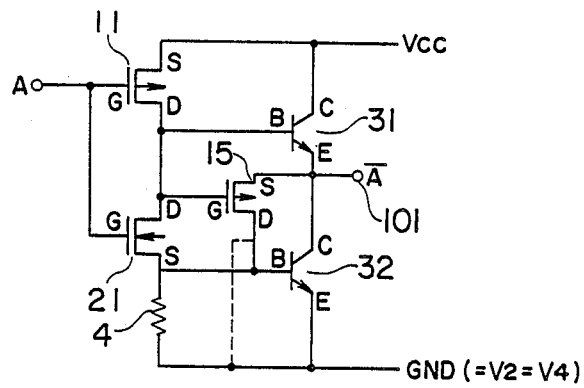
FIG. 23 is a diagram showing an inverter circuit according to a 16th embodiment of the present invention.

FIG. 23 shows an inverter circuit according to a 16th embodiment of the present invention, in which the component elements identical or equivalent to those in FIG. 22 are designated by the same reference numerals as those in FIGS. 22.

In this embodiment, instead of the PNP 63 in the 15th embodiment shown in FIG. 22, a P-MOS 15 is provided as a unidirectional element. The source S of the P-MOS 15 is connected to an output terminal 101, and the gate G thereof to the drain D of the N-MOS 21, the base B of the first NPN 31 and the drain D of the P-MOS 11. The drain of the P-MOS 15 is connected to the base B of the second NPN 32 and the source S of the N-MOS or, as shown by the dashed line in FIG. 23, to the earth potential GND making up a second potential $V_2$.

EMBODIMENT 17

Figure 24:
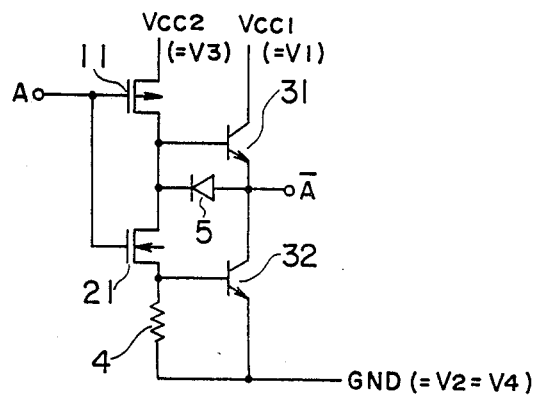
FIG. 24 is a diagram showing an inverter circuit according to a 17th embodiment of the present invention.

FIG. 24 shows an inverter circuit according to a 17th embodiment of the present invention, in which the component elements identical or equivalent to those in FIGS. 4 and 5 are designated by the same reference numerals as in FIGS. 4 and 5.

This embodiment is different from the second embodiment shown in FIG. 5 in that, in this embodiment, the first potential $V_1$ is set to a first power source potential VCC1, and the third potential $V_3$ to a second power source potential.

In this embodiment, the base current of the first NPN 31 is supplied from the second power source VCC2 through the P-MOS 11, and therefore the output terminal 101 is clamped by the potential determined by VCC2. In this condition, no current flows in the first NPN 31, so that power is not consumed at other than the time of switching in this embodiment like CMOS.

The present invention has been explained in detail with reference to embodiments, and it should be understood that various modifications of the invention are possible within the scope of the present invention.

In spite of the foregoing explanation of the 10th to 17th embodiments made with reference to an inverter circuit, for example, the concept of the present invention is applicable with equal effect to a k-input NAND circuit or a k-input NOR circuit.

FIGS. 27 to 32 show such NAND and NOR embodiments, wherein numerals corresponding to earlier figures identify corresponding elements.

Also, the NPNs 31 and 32 with reference to which the fifth to 17th embodiments of the invention have been described above may be reversed in conductivity type as explained with reference to the third and fourth embodiments.

Further, it is also possible to use a bipolar transistor with Schottky barrier diode, and the composite circuit according to the present invention may be used as an output buffer circuit. Furthermore, although the foregoing description concerns a composite circuit including an inverter circuit, a NAND circuit or a NOR circuit, a logic gate circuit with a CMOS transistor may be connected to the first stage of these circuits, and then it is possible to construct an AND circuit, an OR circuit or other logic gate circuit such as a combination logic circuit, or a sequence logic circuit such as a flip-flop, shift register or a latch circuit, without departing from the scope of the present invention.

It will be understood from the foregoing description that according to the present invention, the disadvantages of the conventional composite circuits are eliminated, and there is provided a composite circuit comprising field effect transistors and bipolar transistors high in speed and low in power consumption.

We claim:

1. A NAND gate circuit comprising:
   a plurality of input terminals;
   an output terminal;
   a first bipolar transistor having its emitter-collector current path coupled between a first supply voltage terminal and said output terminal;
   a second bipolar transistor having its emitter-collector current path coupled between said output terminal and a second supply voltage terminal;
   a first plurality of MOS transistors, each having its drain-source current path coupled in parallel between said first supply voltage terminal and a base of said first bipolar transistor, each of said first plurality of MOS transistors having a control electrode coupled to one of said plurality of input terminals;
   a second plurality of MOS transistors, each having its drain-source current path coupled in series between said output terminal and a base of said second bipolar transistor, each of said second plurality of MOS transistors having a control electrode coupled to one of said plurality of input terminals; and
   a first MOS transistor having its drain-source current path coupled between said base of said second bipolar transistor and said second supply voltage terminal, and having a control electrode coupled to said output terminal.

2. A NOR gate circuit comprising:
   a plurality of input terminals;
   an output terminal;
   a first bipolar transistor having its emitter-collector current path coupled between a first supply voltage terminal and said output terminal;
   a second bipolar transistor having its emitter-collector current path coupled between said output terminal and a second supply voltage terminal;
   a first plurality of MOS transistors, each having its drain-source current path coupled in series between said first supply voltage terminal and a base of said first bipolar transistor, each of said first plurality of MOS transistors having a control electrode coupled to one of said plurality of input terminals;
   a second plurality of MOS transistors, each having its drain-source current path coupled in parallel between said output terminal and a base of said second bipolar transistor, each of said second plurality of MOS transistors having a control electrode coupled to one of said plurality of input terminals; and
   a first MOS transistor having its drain-source current path coupled between said base of said second bipolar transistor and said second supply voltage terminal, and having a control electrode coupled to said output terminal.

3. An inverter circuit comprising:
   an input terminal;
   an output terminal;
   a first bipolar transistor having its emitter-collector current path coupled between a first supply voltage terminal and said output terminal;
   a second bipolar transistor having its emitter-collector current path coupled between said output terminal and a second supply voltage terminal;
   a first MOS transistor having its drain-source current path coupled between said first supply voltage terminal and a base of said first bipolar transistor, said first MOS transistor having a control electrode coupled to said input terminal;
   a second MOS transistor having its drain-source current path coupled between said output terminal and a base of said second bipolar transistor, said second transistor having a control electrode coupled to said input terminal; and
   a MOS transistor having its drain-source current path coupled between said base of said second bipolar transistor and said second supply voltage terminal, and having a control electrode coupled to said output terminal.

4. A gate circuit comprising:
   at least one input terminal;
   an output terminal;
   a first bipolar transistor having its emitter-collector current path coupled between a first supply voltage terminal and said output terminal;
   a second bipolar transistor having its emitter-collector current path coupled between said output terminal and a second supply voltage terminal;
   at least one first MOS transistor having its drain-source current path coupled between said first supply voltage terminal and a base of said first bipolar transistor, said first MOS transistor having a control electrode coupled to said input terminal;
   at least one second MOS transistor having its drain-source current path coupled between said output terminal and a base of said second bipolar transistor, said second MOS transistor having a control electrode coupled to said input terminal; and
   a MOS transistor having its drain-source current path coupled between said base of said second bipolar transistor and said second supply voltage terminal, and having a control electrode coupled to said output terminal.

* * * * *